United States Patent

Taniguchi et al.

[11] Patent Number: 5,635,317
[45] Date of Patent: Jun. 3, 1997

[54] PREPARATION AND REPRODUCTION OF FILTERS AND PREPARATION OF FILTER PHOTOGRAPHIC MATERIALS

[75] Inventors: Yukio Taniguchi; Minoru Utsumi, both of Tokyo, Japan

[73] Assignee: Dai Nippon Printing Co., Ltd., Tokyo, Japan

[21] Appl. No.: 416,182

[22] Filed: Apr. 4, 1995

Related U.S. Application Data

[62] Division of Ser. No. 613,684, Nov. 15, 1990.

[30] Foreign Application Priority Data

| Mar. 16, 1989 | [JP] | Japan | 1-64259 |
| Mar. 16, 1989 | [JP] | Japan | 1-64260 |
| Mar. 18, 1989 | [JP] | Japan | 1-67250 |

[51] Int. Cl.$^6$ .................................................. G03F 9/00
[52] U.S. Cl. .................... 430/7; 430/20; 430/256
[58] Field of Search .......................... 430/7, 20, 27, 430/329, 383, 357, 356, 127

[56] References Cited

U.S. PATENT DOCUMENTS

| T861,026 | 4/1969 | Harper et al. . |
| 3,506,327 | 4/1970 | Leith et al. . |
| 3,567,305 | 3/1971 | Collier et al. . |
| 3,633,989 | 1/1972 | Benton . |
| 3,647,289 | 3/1972 | Weber . |
| 3,758,186 | 9/1973 | Brumm . |
| 3,776,727 | 12/1973 | Nassenstein et al. . |
| 4,071,291 | 1/1978 | Suzuki et al. . |
| 4,171,766 | 10/1979 | Ruell . |
| 4,244,633 | 1/1981 | Kellie . |
| 4,370,936 | 2/1983 | Sato et al. ............................. 430/7 |
| 4,719,160 | 1/1988 | Gerhart et al. . |
| 4,778,262 | 10/1988 | Haines . |
| 4,788,116 | 11/1988 | Hochberg . |
| 4,877,697 | 10/1989 | Vollmann et al. ...................... 430/20 |
| 4,889,780 | 12/1989 | Cosner . |
| 4,958,892 | 9/1990 | Jannson et al. . |

FOREIGN PATENT DOCUMENTS

| 47-26753 | 10/1972 | Japan . |
| 53-36335 | 10/1978 | Japan . |
| 56-4108 | 1/1981 | Japan . |
| 57-8213 | 7/1982 | Japan . |
| 63-47131 | 3/1988 | Japan . |

OTHER PUBLICATIONS

Born & Wolf "Principles of Optics" 1970; p. 280; Fourth Edition; Pergmon Press.

*Primary Examiner*—Thorl Chea
*Attorney, Agent, or Firm*—Armstrong, Westerman, Hattori, McLeland & Naughton

[57] ABSTRACT

A filter photographic material is produced by laminating together, in opposite relation, a first laminate obtained by laminating a filter layer and an adhesive layer successively on a support and a second laminate obtained by laminating a photoconductive layer and a transparent electrode layer successively on a carrier film through a release layer, followed by removal of the carrier film. Thus, it is possible to prevent the discoloration, fading, etc. of the filter layer and its preparation is made more efficient.

2 Claims, 6 Drawing Sheets

36 RECONSTRUCTED LIGHT AND REFERENCE LIGHT

PREPARATION AND REPRODUCTION OF FILTERS AND PREPARATION OF FILTER PHOTOGRAPHIC MATERIALS

This is a division of application Ser. No. 07/613,684 filed Nov. 15, 1990.

TECHNICAL FIELD

The present invention relates to preparing and reproducing filters and preparing filter photographic materials. More particularly, this invention is concerned with preparing and reproducing color filters by the application of holography and preparing filter photographic materials well-suited for recording electrostatic images.

BACKGROUND TECHNIQUE

Color filters so far used in various fields are of the dyed type. Because of their processes of preparation being complicated, however, it has been attempted to prepare color filters by the application of holography.

FIG. 1 is a view for illustrating a conventional process for making color filters by the application of holography.

Referring to FIG. 1, a photosensitive or photographic material 12 is located in opposition to a mirror 13 and a mask 11 having a striped pattern, for instance, is brought into close contact with the material 12. Light incident from above the mask 11 is reflected from the mirror 13 to make an interference fringe, which is in turn recorded in the photographic material 12 to prepare a color filter.

When dirt, dust, etc. are present between the photographic material and the mask in close contact with it, the gap varies, giving rise to the blurring of the mask image. Thus, a serious problem with such a conventional process as shown in FIG. 1 is that a considerable difficulty is encountered in bringing the photographic plate in constantly close contact with the mask in a certain relation.

Even though the close contact is achieved at a certain interval, it is most likely that the mask image may blur due to the thickness of the photographic material itself.

Color filters heretofore used are of the dyed type.

FIG. 2 is a view showing a conventional process for making the dyed type of color filters.

As illustrated, a gelatine layer is first coated on a glass substrate 22 and then subjected to pattern exposure to form a gelatine pattern layer. Next, a dye is fixed to the gelatine pattern layer 23 by treatments with, e.g., tannic acid to make a monochromatic pattern filter. A color filter, which may be in striped, mosaic or other forms, is obtained by repeating the pattern exposure and the formation of the gelatine and dyed pattern layers for each of three colors.

A problem with such a conventional process for making the dyed type of color filters as shown in FIG. 2, however, is that its process of preparation is too complicated to increase the production cost. Another problem is that it is difficult to make a pattern of sufficient resolution.

Still another problem is that a serious difficulty is experienced in getting the overlapping chromatic images in correct registration, since it is required to carry out pattern exposure for each of three colors cyan, magenta and yellow or red, green and blue.

On the other hand, silver salt photography is known as a high-sensitivity photographic technique, in which a photographic image is recorded on a film or the like through a developing step. The image is reproduced with a silver salt emulsion (photographic paper, etc.) or displayed on a cathode ray tube (CRT for short) by the optical scanning of the developed film.

There is also now available an electrophotographic technique. According to this technique, an electrode is deposited onto a photoconductive layer, the photoconductor is electrified on its overall surface by corona electrification in a dark place and then exposed to intense light to make a light-striking region electrically conductive. That region is then rid of charges to optically form an electrostatic latent image on the surface of the photoconductor. Finally, a toner having charges of polarity different from or identical with that of the residual charges is deposited onto the latent image for development. This is primarily used for copying purposes, and cannot be used for photographic purposes due to its low sensitivity. Also, toner development should usually be carried out just after the formation of the latent image, because the retention time or duration electrostatic charges is short.

According to a further technique now available—a TV photographic technique, the original image is picked up by a pickup tube, and the image-carrying information obtained by making use of an optical semiconductor is outputted in the form of electrical signals, which are immediately used to make an image on a CRT. Alternatively, the signals may be recorded on a video tape or the like by magnetic recording hardware for making an image on the CRT at any desired time.

The silver salt photographic technique provides an excellent means for preserving the original image, but needs not only a developing step for making a silver salt image but also sophisticated optical, electrical or chemical processings from hard copying to soft copying (CRT displaying) for the reproduction of the image.

Electrophotography provides a simpler and faster development of the obtained latent image than does the silver salt photographic technique, but is much inferior in the dissociation of a developer, image quality, etc. to the silver salt technique, because the duration of the latent image is very short.

TV photography needs line sequential scanning for outputting or recording the electrical image signals obtained by the pickup tube. The line sequential scanning is performed either by electron beams in the pickup tube or by a magnetic head for video recording. However, this recording technique is much inferior to planar analog recording such as silver salt recording, because its resolution is dependent upon the number of the lines to be scanned.

This is again true of the resolution of a TV photographic system now under development, which makes use of a solid photographic element (CCD, etc.)

The problems associated with these techniques imply that the higher the quality and resolution of the recorded image, the more complicated the processing steps, or the simpler the processing steps, the poorer the storing or memory function, the image quality, etc.

The inventor has applied a patent application (Japanese Patent Application No. 63(1988)-121592 for a process for recording and reproducing electrostatic images, wherein a photographic material comprising a photoconductor layer having an electrode formed on its front surface and a charge carrier medium comprising a charge carrier layer having an electrode formed on its rear surface are located on an optical axis in opposite relation, and the assembly is then exposed to light while applying voltage between both the electrodes to form on the charge carrier medium an electrostatic latent image corresponding to the incident optical image.

According to this process for recording and reproducing electrostatic images, the photographic material is provided by laminating a photoconductive layer on an electrode, and is located in opposition to the charge carrier medium, following by pattern exposure for the photographic plate while voltage is applied between both the electrodes, thereby accumulating imagewise charges in the charge carrier medium. In this instance, a color filter may be located in the optical path in front of the photographic material to make a color image. The color filter may be spaced away from, or made integral with, the photographic material.

However, much labor and time are required to laminate the color filter individually on the photographic plate.

The present invention seeks to provide a process for preparing a precise color filter by recording a sharp mask image in a photosensitive or photographic material with no need of bringing a mask into precisely close contact with the photographic material.

Another object of this invention is to provide a process for reproducing a color filter which uses a hologram capable of achieving sufficient resolution while dispensing with a photolithographic step, precise alignment or registration, etc.

A further object of this invention is to provide a process for providing an efficient lamination of a filter on a photographic material used in recording electrostatic images.

DISCLOSURE OF THE INVENTION

Briefly, the present invention is characterized in that a photographic material and a mask having a given pattern are located at a given interval in opposite relation and are illuminated with light from the opposite directions to make a hologram, and then the hologram is located in opposition to the photographic material at a given distance therefrom and is illuminated with light through the photographic material, thereby recording in the photographic material an interference fringe made by the light reflected and diffracted by the hologram and the illumination light.

With this arrangement wherein the mask image can be reproduced in the photographic material with no need of bringing the mask into precisely close contact with the photographic material, it is possible to prepare a precise holographic color filter without causing the blurring of the mask image.

The present invention is also characterized in that a master hologram having R, G and B patterns recorded therein is located in opposition to a photographic material, and is then illuminated with light in which three colors R, G and B are mixed together, thereby transferring and reproducing on the photographic material an interference fringe made by the light reflected and diffracted from the hologram and the illumination light.

With this arrangement wherein the image reproduced from the master hologram can be reproduced in the photographic material at one exposure operation, it is possible to dispense with a photolithographic step, precise alignment or registration, etc.

Further, the present invention provides a process for forming a filter photographic material by providing a filter layer on a photographic material obtained by laminating a transparent electrode layer and a photoconductive layer successively on a transparent support, characterized in that a first laminate in which the filter layer and an adhesive layer are laminated successively on the support and a second laminate in which the photoconductive and transparent electrode layers are laminated successively on a carrier film through a release layer are laminated together, while the adhesive layer of the first laminate is located in opposition to the transparent electrode layer of the second laminate, followed by removal of the carrier film.

Still further, the present invention provides a process for making a filter photographic material by providing a filter layer successively on a photographic material obtained by laminating a transparent electrode layer and a photoconductive layer successively on a transparent support, characterized in that a laminate in which the filter layer and an adhesive layer are laminated successively on a carrier film through a release layer and the photographic material in which the transparent electrode and photoconductive layers are laminated successively on the transparent support are laminated together, while the adhesive layer of the laminate is located in opposition to the support of the photographic material, followed by removal of the carrier film, or simultaneously with only the filter layer alone being formed on the back side of said photographic material by heat transfer using a thermal head.

BRIEF DESCRIPTION OF THE DRAWINGS

FIG. 2, 2(a)–2(e), is a view showing a conventional process for making a dyed type of color filter, FIGS. 3 and 4 each are a view for showing the process for making a color filter according to this invention.

BEST MODE FOR CARRYING OUT THE INVENTION

Figure 1:
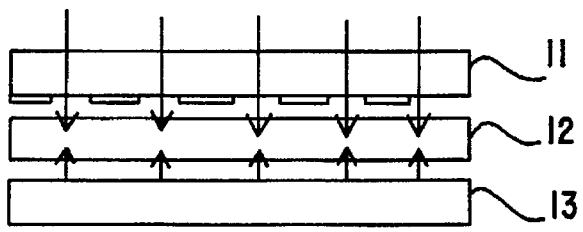
FIG. 1 is a view for illustrating a conventional process for making a color filter with the aid of holography.
Figure 2A:
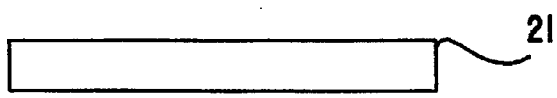
Figure 2B:
Figure 2C:
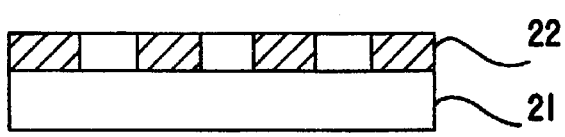
Figure 2D:
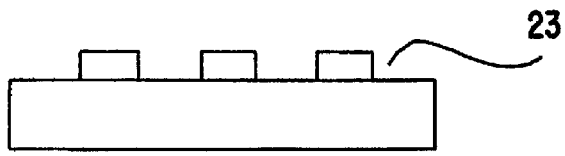
Figure 2E:
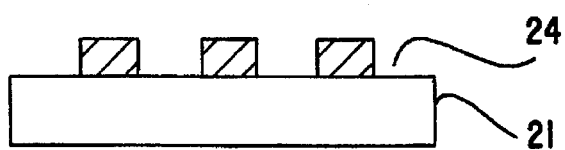
Figure 3:
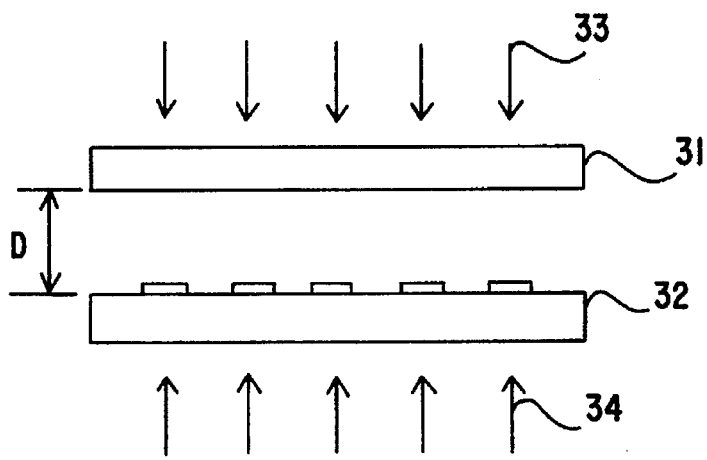
Figure 4:
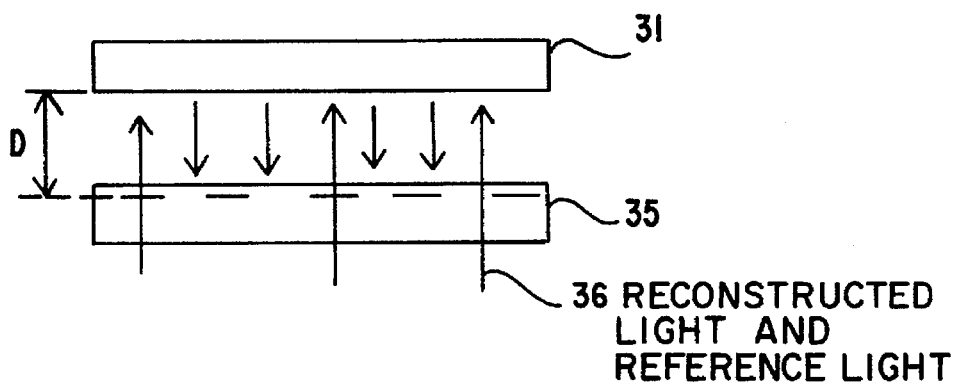

One embodiment of the process for making a color filter according to this invention is illustrated in FIGS. 3 and 4, wherein reference numeral 31 stands for a photographic material, 32 a mask, 33 and 34 illumination beams, 35 a photographic material, and 36 reconstructed and reference beams.

As illustrated in FIG. 3, the photographic material 31 is spaced away from the mask 32 at a given interval D. The mask 32, for instance, has a striped pattern. The photographic material 31 and the mask 32 are illuminated with the beams 33 and 34 from the opposite directions. The light 34 transmitted through the mask 32—referred to as the object light—and the reference light 33 make an interference fringe which is in turn recorded in the photographic material 31 to prepare a Lippmann hologram.

As illustrated in FIG. 4, the thus prepared hologram 31 is located at a given distance from the photographic material 35, and is then illuminated with the light 36 through the photographic material 35. In consequence, the light diffracted from the hologram and the illumination light 36 form an interference fringe (the mask image) at a location spaced away from the hologram 31 by the distance D, where the photographic material 35 is positioned such that it overlaps with the mask image. Since the photographic material can be superposed on the mask image in this manner, the mask image can be recorded much more sharply without causing it to blur, rendering it possible to make a precise color filter. Thus, any precisely close contact of the photographic material with the mask can be dispensed with.

It is understood that if exposure is repeated three times at different mask positions using red, green and blue beams as the illumination beams 33 and 34, it is then possible to record a striped image of red, green and blue in a single photographic material. It is thus possible to prepare a color filter by reconstructing and recording the striped image of red, green and blue using red, green and blue beams as the light 36.

It is again possible to prepare a color filter by recording striped images of red, green and blue in three photographic materials and making records at different mask positions at the time of reproduction.

According to the process described with reference to FIGS. 3 and 4, it is thus possible to make a very sharp mask image by superposing the photographic material on the position of the mask image reconstructed with neither need of bringing the photographic material into precisely close contact with the mask nor fear of shading off the mask image.

Figure 5:
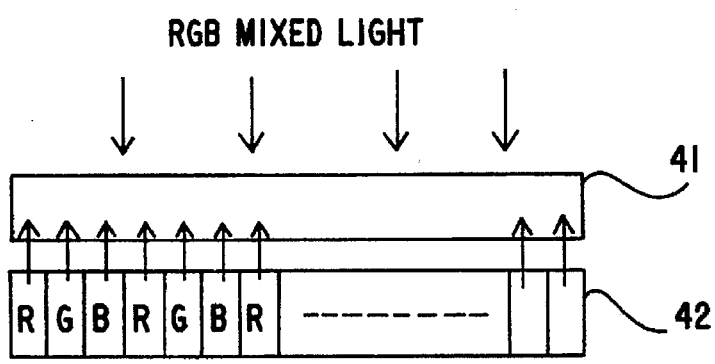
FIG. 5 is a view for illustrating the process for reproducing a color hologram according to this invention, FIG. 6, including (a) and (b), is a sectional view of a laminate used with the process for making a filter photographic material according to this invention.

How to reproduce a color hologram usable as a filter is illustrated in FIG. 5, wherein reference numeral 41 stands for a photographic material and 42 a master hologram.

Referring to FIG. 5, the master hologram 42 is a Lippmann hologram having regions in which interference fringes of red, green and blue are recorded individually. The photographic material 41 is located in opposition to the master hologram 42. As the hologram 42 is illuminated from above the material 41 with light obtained by mixing of red, green and blue, the light diffracted from the hologram 42 and the incident light make an interference fringe, which is in turn recorded in the photographic material 41. In this manner, the pattern of the master hologram 42 is transferred and reproduced on the photographic material 41 at one exposure operation.

It is noted that there is too large a gap between the photographic material and the master hologram, some light reflected from the adjacent region enters through it, making an interference fringe, which is then recorded in the same place, blurring the mask image. Hence, the gap between both should be reduced as much as possible. For instance, such a gap should preferably be determined depending upon how large the pattern is, for instance, be one half or less of an inter-stripe gap in the case of a striped type of filter.

It is understood that while the foregoing embodiment has been described specifically with reference to a striped filter, the present invention may equally be applicable to other filters such as a meshed filter.

According to the process described with reference to FIG. 5, it is possible to reproduce the master hologram at one exposure operation and so make a color hologram of excellent resolution without needing precise alignment or registration.

A specific embodiment, in which a color filter is applied to recording electrostatic latent images, will now be explained with reference to processes for making a photographic material having a color filter.

Figure 6A:
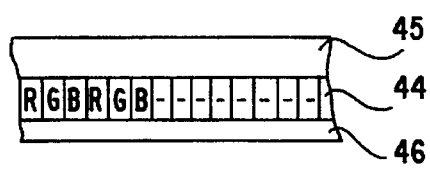
Figure 6B:
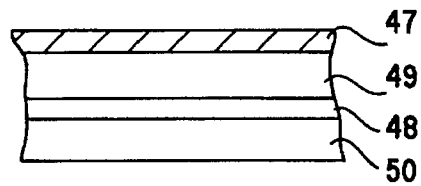
Figure 7:
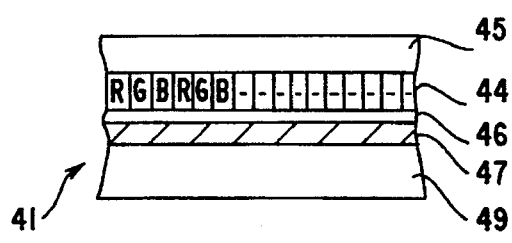
FIG. 7 is a sectional view of the filter photographic material made by this invention, FIGS. 8, including (a) and (b), is a sectional view of a laminate used with another process for making a filter photographic material according to this invention.

FIGS. 6a and 6b are schematic sections of first and second laminates, respectively, used with the processes for making a photographic material with a color filter, and FIG. 7 a sectional view of a photographic material with a color filter made by a first process. In these drawings, reference numeral 41 stands for a general structure of a photographic material with a color filter, 44 a color filter, 45 a support for the photographic material, 46 an adhesive layer, 47 a photographic electrode, 48 a release layer, 49 a photoconductive layer and 50 a carrier film.

The filter photographic material produced by the first process of this invention is of a structure wherein the support 45, filter 44, adhesive layer 46, photographic electrode 47 and photoconductor 49 are successively laminated together, as shown in FIG. 7.

This filter photographic material is prepared by laminating together a first laminate shown in FIG. 6a with a second laminate shown in FIG. 6b, while the adhesive layer 46 of the first laminate is located in opposition to the photographic electrode 47 of the second laminate.

The first laminate is formed by laminating the filter 44 and adhesive layer 46 successively on the support 45.

The filter may be a layer formed by coating a photographic material such as a silver salt, gelatine bichromate or a photopolymer, e.g., a photoresist on the support 45. At this stage, the layer may be colored or dyed in red, green and blue or allowed to bear a hologram, dots, an image, characters or marks. This layer has a function of providing the photoconductive layer with a pattern.

For instance, the color filter may be formed by any one of the following known methods. According to one method, a photoresist is first coated on a support to form a film. Then, the film is exposed to light through a mask pattern to form a striped pattern, which is in turn dyed in red, green and blue. According to another method, prismatic light is passed through narrow slits to form an interference fringe of red, green and blue, which is in turn recorded on a holographic recording medium. According to still another method, a photoconductor with a mask in close contact with it is exposed to light to form a striped pattern of red, green and blue by an electrostatic latent image. The striped pattern is then toner-developed and transferred three times for color mixing, thereby forming a toner stripe. The thus obtained filter defines one pixel as fine as 10 μm by a set of red, green and blue.

In addition to such color filters, use may also be made of holographic, dyed, pigmented or interference filters.

The film layer formed on the support is provided thereon with an adhesive layer for bonding to the second laminate. The adhesives, which should be transparent, may be coated on the film by suitable means such as spinner or blade coating, if required, after dissolved in a solvent.

The second laminate shown in FIG. 6b will now be explained.

The second laminate is formed by laminating the photoconductive layer 49 and transparent electrode layer 47 successively on the carrier film 50 through the release layer 48.

The carrier film may have a strength sufficient to support the photoconductor 49 and transparent electrode layer 47 and so may be formed of paper, a plastic film or sheet or the like. The release layer provided on the carrier film may be formed of a material based on silicone, fluorine or other resin, which is dissolved in a polar solvent for coating.

The photoconductive layer laminated on the release layer is a semiconductor layer which generates light carriers (positive holes and electrons) upon irradiated with light and has a function of transporting them. To this end, an inorganic photoconductive material such as amorphous selenium, amorphous silicon, zinc oxide, cadmium oxide or lead oxide may be coated on the release layer with a binder, a solvent and so on by suitable means such as vapor deposition, sputtering, plasma CVD, ECRCVD or MOCVD. Alternatively, an organic photoconductive material may be coated on the release layer with a binder, a solvent and so on. As the organic photoconductive material, use may be made of either one of a single layer system having both charge-generating and-transporting functions and a so-called function-separation type of laminate system in which the charge-generating function is separate from the charge-transporting function. Typical of the former are single-layer photosensitive systems comprising mixtures of PVK-TNF, PVK-triphenylmethane type dye, PVK-pyrylium type dye and PVK-xanthene type dye, and typical of the latter mixed systems in which the charge generating layers comprise dispersion systems of, e.g., azo type pigment-binder and phthalocyanine-binder while the charge transporting layers comprise mixtures of binders with materials based on hydrazone, pyrazoline, polyvinylcarbazole (PVK), carbazole, oxazole, triazole, aromatic amine, amine, triphenylmethane and polycyclic aromatic compounds. The inorganic photoconductive materials may be used in combination with the organic photoconductive materials and organic charge transporting materials.

The support 45 may have a certain strength sufficient to support the photographic material. Although the support 45 is not critical in terms of thickness and material, it should be transparent. To this end, use may be made of a rigid material such as glass or plastic sheets, but preference is given to a transparent glass sheet or a transparent film or sheet of flexible plastics, all having a thickness of about 1 mm.

The electrode 47, which is provided on the support 45, may be formed of any material having a specific resistance of $10^6 \Omega \cdot cm$ or less. To this end, use may be made of a conductive film of a semitransparent inorganic metal or transparent metal oxide or an organic conductive film of a quaternary ammonium salt, etc. Such an electrode 47 is formed on the support 45 by suitable means such as vapor deposition, sputtering, CVD, coating, plating, dipping and electropolymerization. However, the electrode 47 should vary in thickness depending upon the electrical properties of the material forming it and the voltage applied for the recording of information. Like the support 45, the electrode 47 has to possess such optical properties as mentioned above. For instance, if the information-bearing light is visible light (400–700 nm), use may then be made of a transparent electrode obtained by the sputtering or vapor deposition of a material such as ITO ($In_2O_3$—$SnO_2$) or $SnO_2$ or the coating of an ink composition comprising finely divided powders thereof and a binder; a semitransparent electrode prepared by the vapor deposition or sputtering of a metal such as Au, Al, Ag, Ni or Cr; and an organic transparent electrode obtained by the coating of an organic material such as tetracyanoquinodimethane (TCNQ) or polyacetylene.

The above-mentioned electrode materials may also be used in the case where the information-bearing light is infrared light (700 nm or more). In some cases, a colored electrode capable of absorbing visible light may be used so as to cut off visible light.

Basically, the above-mentioned electrode materials may be used even in the case where the information-bearing light is ultraviolet light (400 nm or below). However, the use of a support material absorbing ultraviolet light (such as an organic polymeric material and soda glass) should be avoided. Preferable to this end is a material such as quartz glass, which can transmit ultraviolet light therethrough. Additionally, an anti-reflection layer be provided on the surface on which light is incident, i.e., on the support 45 in FIG. 7 or on the filter 44 in FIG. 9. The anti-reflection layer may be formed of a single or plural thin films obtained by the sputtering, vapor deposition or other processing of an inorganic material such as magnesium fluoride or titanium oxide.

According to this invention, the thus formed second laminate and the aforesaid first laminate are laminated together. As illustrated in FIGS. 6a and 6b, the laminates provided in sheet forms may be bonded together and then cut to a size well-fit for photographic material. Alternatively, the support 45 of the first laminate and the carrier film 50 of the second laminate may be formed of plastic films so as to provide both the first and second laminates in roll forms. By doing so, it is possible to carry out continuously the steps of bonding together the first and second laminates, releasing the carrier film and cutting the resulting laminate to a size well-fit for photographic material.

Figure 8A:
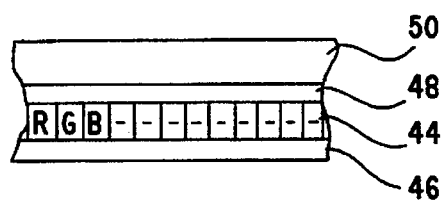

The laminate used with the second process according to this invention and the photographic material prepared thereby will now be explained with reference to FIGS. 8 and 9, respectively.

Figure 8B:
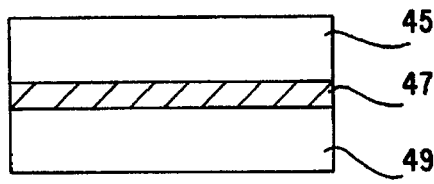
Figure 9:
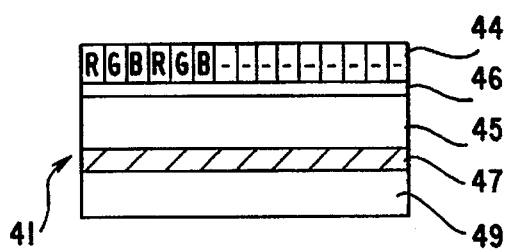
FIG. 9 is a sectional view of a filter photographic material made by a further process of this invention.

As illustrated in FIG. 9, the photographic material is formed by laminating the filter layer 44 on one side of the support 45 through the adhesive layer 46 and laminating the transparent electrode layer 47 and photoconductive layer 49 successively on the other side of the support 45. This photographic material is prepared by bonding the laminate, in which the filter 44 and adhesive layer 46 are laminated through the release layer 48 on the carrier film 50 shown in FIG. 8a, at that adhesive layer 46 to the support 45 of the photographic material shown in FIG. 8b, followed by removal of the carrier film 50 and release layer 48.

The materials forming the respective layers of the photographic material shown in FIG. 9 may be the same as those mentioned in connection with the process for making the above-mentioned first photographic material, and may be laminated together in the same manner as mentioned in connection with the above-mentioned first process.

Figure 10A:
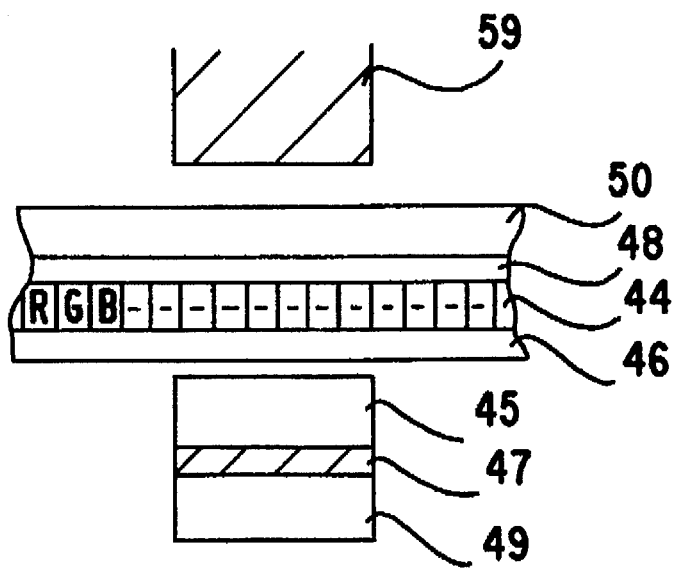
FIG. 10(a) and (b), is a schematic view of a heat transfer unit used with a still further process of this invention, FIG. 11, including (a)–(d), is a view for illustrating how to record electrostatic images.
Figure 10B:
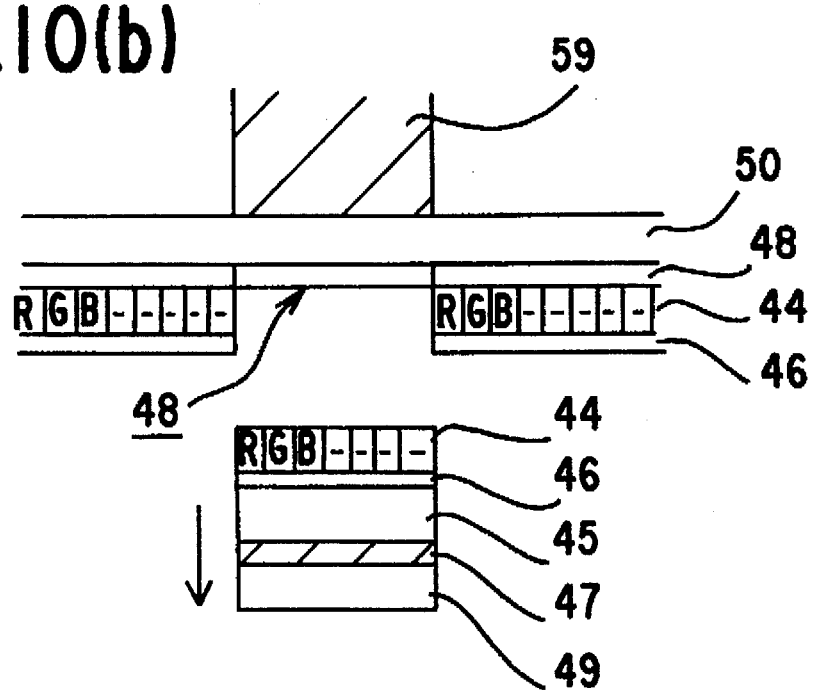

In accordance with this second process, the laminate provided in sheet form may be cut to a size well-fit for photographic material, followed by removal of the carrier film. Alternatively, the photographic material may be provided in usable form as shown in FIG. 8b, and only the filter layer 44 may then be transferred onto the photographic material 41 through the adhesive layer 46 with the aid of a thermal head, as shown in FIG. 10, while making use of the releasability of the filter layer 44. In this case, if a continuous length type of laminate is used as the laminate shown in FIG. 8a, it is then possible to automate the preparation of filter photographic materials by transferring filter layers continuously on photographic materials, while moving it.

Referring now to FIG. 11, how to record electrostatic images will be explained. In this figure, reference numeral 41 stands for a filter photographic plate, 43 a charge carrier medium, 51 a charge carrier layer, 53 an electrode for the charge carrier medium, 55 a support for the charge carrier medium, and 57 a power source.

The charge carrier medium 43, on which an electrostatic latent image is to be formed through the photographic material, is formed by laminating the charge carrier layer on the electrode 53, and comprises a high molecular material of insulating properties so high as to prevent the migration of charges. In other words, this material is required to have such insulating properties as expressed in terms of a specific resistance of $10^{14}\Omega$·cm or above. Also, the high molecular material forming the charge carrier layer is required to have a glass transition temperature higher than an ambient temperature at which it is to be used.

Such a high molecular material may be any one of thermoplastic resin, heat curing resin, ultraviolet curing resin, radiation curing resin such as electron beam curing resin and engineering plastics. The thermoplastic resins, for instance, may include fluorine resins such as polytetrafluoroethylene, fluorinated ethylene propylene, tetrafluoroethylene-perfluoroalkylvinyl ether copolymers or their dispersion or modified (coating) versions; polyether ether ketone resin; poly(p-xylene); and so on. These resins may be coated, vapor-deposited or otherwise provided on the electrode 53 in layer form.

FIG. 11 provides an illustration of how the electrostatic latent image is formed on the charge carrier medium 43 by exposing it to light from above the photographic plate 41.

As illustrated, the charge carrier medium 43 is positioned with respect to the photographic plate 41 through a gap of about 10 µm. This charge carrier medium 43 is provided by vapor-depositing a 100 A-thick aluminium electrode 53 on the support 55 comprising a 1 mm-thick glass and then forming the charge carrier layer 51 on this electrode.

Figure 11A:
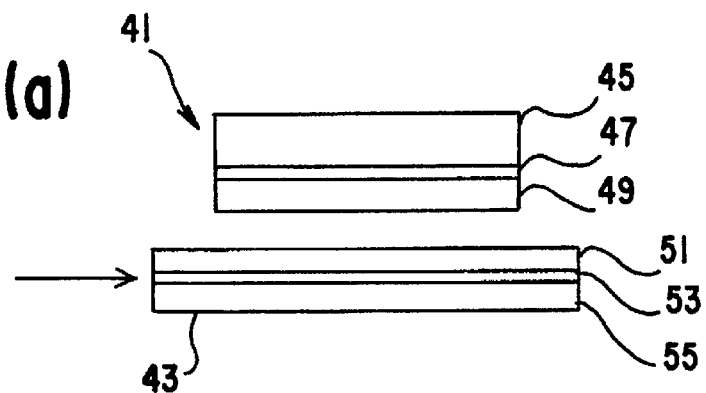
Figure 11B:
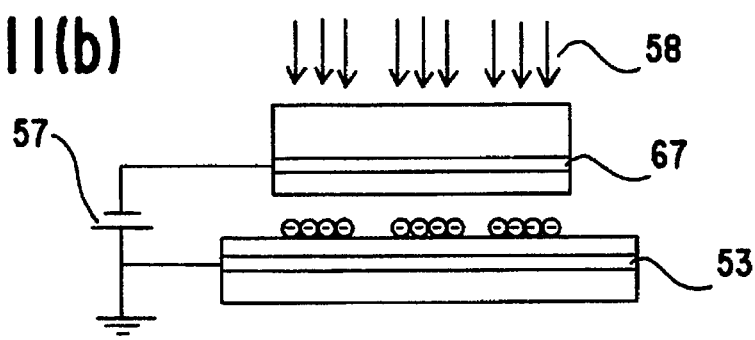

As illustrated in FIG. 11a, the charge carrier medium 43 is arranged with respect to the photographic plate 41 through a gap of about 10 µm. Then, voltage is applied from the power source 57 between the electrodes 47 and 53, as illustrated in FIG. 11b. Because the photoconductive layer 49 is a high resistor in a dark place, no change takes place between the electrodes. If a voltage higher than the firing voltage according to the Paschen's law is applied across the gap depending upon the magnitude of the impressed voltage or a leakage current from the substrate electrode, then discharge occurs across the gap, forming electrostatic changes corresponding to a dark current on the charge carrier medium. As light is incident from the photographic plate 41 through the filter 44, light carriers (electron holes) are generated on a portion of the photoconductive layer 49 on which the light strikes. Then, charges of the polarity opposite to that of the charge carrier medium's electrode migrate from within toward the surface thereof, during which upon the voltage across the air gap exceeding the firing voltage according to the Paschen's law, corona discharge takes place with respect to the charge carrier layer 51 or charges are pulled out of the photoconductive layer 49 due to field emission, so that charges are accelerated by the field and thus accumulated on the charge carrier layer 51.

Figure 11C:
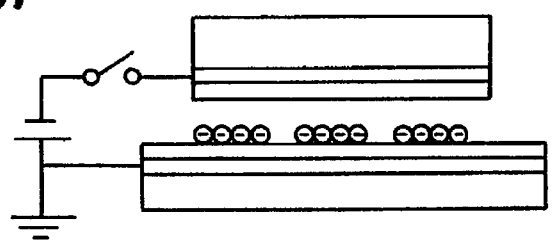
Figure 11D:
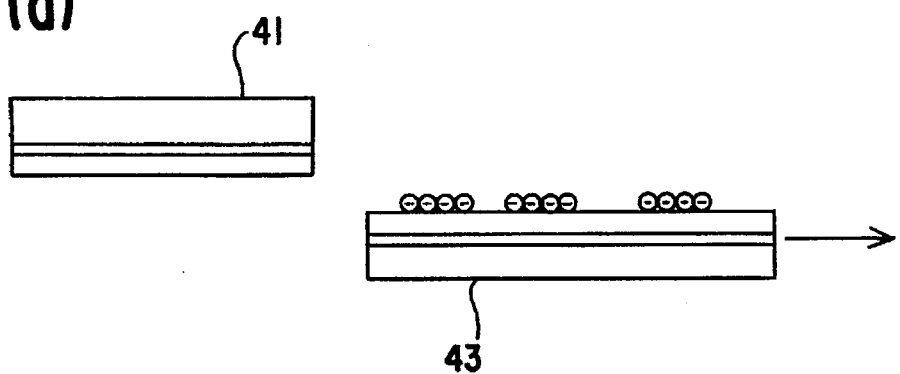

After the exposure has been complete, the voltage is put off as illustrated in FIG. 11c, and the charge carrier medium 43 is then removed as shown in FIG. 11d, making the formation of an electrostatic latent image complete.

At the time when the image is accumulated in the form of information-bearing charges, an insulating protective film may be laminated on the charge carrier layer. It is noted that recording is possible from above the protective film, if it has a thickness of 0.4 µm or below. Thus, the information-bearing charges can be stored over an extended period of time, whether in a dark or bright place. Also, whether stored on the surface of the charge carrier layer or microscopically trapped in electron or hole forms in the vicinity of the surface of the insulator, the information-bearing charges are stored over an extended period of time.

Inputting information to the charge carrier medium may be achieved by using a high-resolution electrostatic camera or laser. Referring first to the high-resolution electrostatic camera, a recording medium is constructed using a photographic material and a charge carrier medium in place of a usual photographic film. Voltage is applied between both electrodes to make the photoconductive layer electrically conductive and so accumulate charges on the charge carrier layer depending upon the quantity of incident light, whereby an electrostatic latent image corresponding to the inputted optical image is formed on the charge accumulating medium. To this end, a shutter of either the mechanical or electrical type may be used. The electrostatic latent image can be stored over an extended period of time, whether in a dark or bright place.

When the filter 44 is a color filter for separating optical information prismatically into red, green and blue components to obtain it in the form of parallel beams, one frame may be defined by three sets of the charge carrier media subjected to the R, G and B separation for color photography. To this end, one frame may also be formed by one set of R, G and B images arranged on one plane. For laser recording, argon laser (514 nm, 488 nm), helium-neon laser (633 nm) or semiconductor laser (780 nm, 810 nm, etc.) may be used as the light source. Voltage is then applied with a photographic material being brought in close planar contact with or in opposition to a charge carrier medium at a certain interval. In this case, the photographic electrode may be the same polarity as that of the carrier of the photographic material. In that state, laser exposure corresponding to imagewise, literal, cord or line signals is carried out by scanning. Analog recording for information such as picture images is carried out by the modulation of the light intensity of laser beams, while digital recording for characters, cords or line pictures is effected by the on-off control of laser beams. Dotted imaging may also be carried out under the dot generator on-off control of laser beams.

Reference will now be explained with reference to how to reproduce the recorded electrostatic image.

Figure 12:
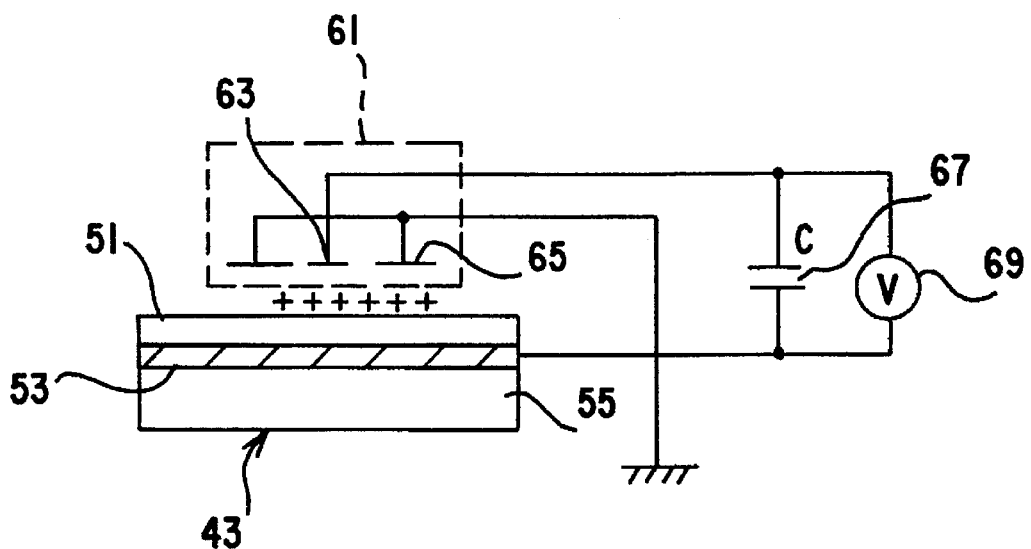
FIG. 12 is a view illustrating how to read potentials in a d.c. amplification manner.

An example of how to read potentials in the process for reproducing an electrostatic image on the charge carrier medium according to this invention is illustrated in FIG. 12 wherein like reference numerals of FIG. 6 refer to like parts. It is noted that reference numeral 61 stands for a potential reader section, 63 a detection electrode, 65 a guard electrode, 207 a capacitor and 69 a voltmeter.

When the potential reader section 61 FIG. 12 is located in opposition to the surface of the charge carrier medium 43 on which charges are built up, the detection electrode 63 is subjected to an electric field defined by the charges accumulated on a charge carrier 51 of the charge carrier medium 43, thus generating on its surface induction charges in the amount equal to that of the charges of polarity opposite to that of such induction charges in the same amount, there is a potential difference corresponding to the accumulated charges across the capacitor's electrode, which is in turn read on the voltmeter 69, thereby determining the potential of the charge carrier medium. Then, an electrostatic latent image can be produced in the form of electrical signals by scanning the surface of the charge carrier medium with the potential reader section 61. It is noted that only with the detection electrode 63, there is a drop of resolving-power under the action of an electric field (an electric line of force) defined over a range wider than the region of the recording medium opposite to the detection electrode; hence, the guard electrode 65 may be grounded around the detection electrode. According to such a system, since the electric line of force acts vertically to the plane, it can be obtained from only the region opposite to the detection electrode 63. Thus, it is possible to read the potential of a region having an area nearly equal to that of the detection electrode. Since the accuracy and resolving-power of potential reading vary largely depending upon the geometry and size of the detection and guard electrodes as well as the space between them and the charge carrier medium, it is essentially required to design them while taking into account the optimum conditions to meet the performance demanded.

The image-carrying charges on the charge carrier medium may be reproduced in the form of information through an electro-optical crystal by exposing the medium to laser beams, etc. from the electrode of the charge carrier medium provided with the anti-reflect/on layer. In this case, the charge carrier medium should be formed of a transparent material, while the electro-optical crystal, which may be formed of an electro-optical material such as barium titanate or lithium tantalate ($LiTaO_3$), may be positioned within the optical path.

Figure 13:
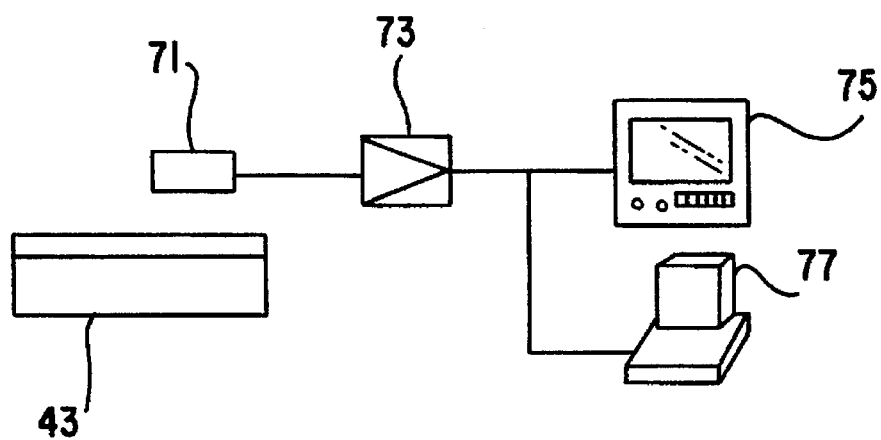
FIG. 13 is a view of a general structure of how to reproduce an electrostatic image.

FIG. 13 is a schematic view showing the process for reproducing electrostatic images according to this invention, in which reference numeral 71 stands for a potential reader, 73 an amplifier, 75 a CRT and 77 a printer.

Referring to this figure, a charge potential is detected by the potential reader 71, and the resultant output is amplified by the amplifier 73 for display on the CRT 75 or printing-out with the printer 77. In this case, the region to be read may be arbitrarily selected and outputted at any desired time, or may be repeatedly reproduced. With the electrostatic latent image obtained in the form of electrical signals, it may then be recorded in other recording media, if required.

Used with the charge carrier medium, the filter photographic material is exposed to light from its side while voltage is applied to it, whereby light carriers (e.g., holes) generated in the photoconductive layer of the photographic material are migrated under the action of an electrical field between it and the charge carrier medium toward the surface of the photoconductive layer. Then, discharge occurs across an air gap between the photographic material and the charge carrier medium or the air layer there is ionized, thereby recording the exposure pattern through the filter in the charge carrier medium in the form of electrostatic charges.

Further, the present invention provides a process for forming a filter photographic material by providing a filter layer on a photographic material obtained by laminating a transparent electrode layer and a photoconductive layer successively on a transparent support, characterized in that a first laminate in which the filter layer and an adhesive layer are laminated successively on the support and a second laminate in which the photoconductive and transparent electrode layers are laminated successively on a carrier film through a release layer are laminated together, while the adhesive layer of the first laminate is located in opposition to the transparent electrode layer of the second laminate, followed by removal of the carrier film. According to this process, it is possible to eliminate the discoloration, fading or other degradation of the filter layer due to heating applied for the vapor-deposition of ITO or photoconductive electrodes. In addition, since the filter can be laminated directly on the ITO electrode through the adhesive layer, filter photographic materials can be produced efficiently. Moreover, this process makes the space required for the support much smaller than that required for a glass support, and can give a clear electrostatic image to the charge carrier medium.

Still further, the present invention provides a process for making a filter photographic material by providing a filter layer successively on a photographic material obtained by laminating a transparent electrode layer and a photoconductive layer successively on a transparent support, characterized in that a laminate in which the filter layer and an adhesive layer are laminated successively on a carrier film through a release layer and the photographic material in which the transparent electrode and photoconductive layers are laminated successively on the transparent support are laminated together, while the adhesive layer of the laminate is located in opposition to the support of the photographic material, followed by removal of the carrier film. According to this process, the filter can be easily laminated on the photographic material. With a laminate of continuous length, filter layers are transferred onto a number of photographic materials, while it is moved, so that filter photographic materials can be produced more efficiently.

Illustrative examples of the filter photographic material according to this invention will now be explained.

ILLUSTRATIVE EXAMPLE 1

Preparation of Laminate 1

An aqueous solution of gelatine (having a solid content of 20%) containing 10% by weight of ammonium bichromate heated to 40° C. was coated on a previously washed glass plate (of 1 mm in thickness and 3 inches in size) at 2000 r.p.m. for 30 seconds by spinner coating, and then dried in an oven of 90° for 1 hour to remove the water content, thereby obtaining a gelatine photographic material of 1 µm in thickness. Afterwards, the gelatine surface of the photographic material in alignment with the mask surface of a striped pattern chromium mask plate was closely exposed to ultraviolet rays (a mercury lamp) from the mask surface. After 20-second exposure, the medium was removed and dipped in an aqueous solution of 40° C. to dissolve an unexposed region, thereby forming a negative pattern.

Patterning was completed by oven drying at 70° for 1 hour.

The thus patterned medium was dipped in an aqueous solution containing a 5 g/l of a red dye (Kayanol Milling Red RS commercialized by Nippon Kayaku K.K.)—heated to 50° C. —for 3 minutes, removed therefrom, washed with water, and dried at 2000 r.p.m. for 10 second by spinner drying to dye the patterned gelatine in red. Further, an acrylic resin solution JSS made by Nippon Gosei K.K.) was coated on the gelatine surface at 2000 r.p.m. for 10 seconds by spinner drying to obtain a protective film, which was in turn cured at 150° for 30 minutes to obtain a film of 0.3 µm in thickness.

This process was repeated with green and blue at different patterned chromium mask positions in the same manner as described just above, thereby eventually forming a dyed type of striped color filter an array of red, green and blue arranged at intervals of 10 µm (for green an aqueous solution containing 5 g/l of Kayanol Milling Green 5GW used and for blue an aqueous solution containing 5 g/l of Kayanot Cyanine 6B).

Coated on the obtained striped color filter layer was a polyurethane adhesive solution (Takenate commercialized by Takeda Chemical Industries, Ltd.) at 1000 r.p.m. for 30 seconds by spinner coating, and then dried at 60° C. for 1 hour to form an adhesive layer of 3 μm in thickness. In this manner, Laminate 1 was prepared.

Preparation of Laminate 2

A solution of a heavy-release silicone resin (KS-831 made by the Shin-Etsu Silicone Co., Ltd.), on the other hand, was coated on a 50 μm-thick polyester film of 10 cm² in size (Lumirror made by Panakku Kogyo K.K.) to a coverage of 4 mil by a doctor blade, and then dried at 80° C. for 1 hour to form a release layer of 5 μm in thickness.

Coated on the release layer to a coverage of 8 mil was a mixed solution in which 10 g of PVK (Tsubikoru 210 made by Anon Koryo K.K.) and 1 g of a 2,4,7-trinitrofluorene polyester resin (Vylon 200 made by Toyoho, Ltd.) were dissolved in 100 g of tetrahydrofuran, followed by drying at 60° C. for 1 hour, thereby obtaining a photographic layer of 13 μm in thickness.

A transparent ITO conductive film of about 200 A in thickness was then formed on the photographic layer by sputtering, thereby preparing Laminate 2.

Preparation of Photographic Plate

While the adhesive layer surface of Laminate 1 was in alignment with the ITO electrode surface of Laminate 2, they were passed through a silicone roller laminator heated to 100° C. at a rate of 20 cm/min to bond Laminates 1 and 2 together. After cooling, the PET film was removed to release it and the release layer from the synthetic medium, thereby obtaining a photographic plate according to this invention.

ILLUSTRATIVE EXAMPLE 2

Coated on a previously washed glass substrate (of 1 mm in thickness and 3 inches in size) was a medium-release silicone resin (KS-770 made by the Shin-Etsu Silicone Co., Ltd.) at 1000 r.p.m. for 30 seconds by spinner coating, followed by drying at 80° C. for 1 hour, thereby obtaining a release layer of 1 μm in thickness.

With the same material and in the same manner as described in Ex. 1, a striped color filter layer was provided on the release layer.

Further coated on the filter layer was a 10% toluene solution of an acryl/vinyl acetate copolymer (Hext Synthesis Co., Ltd.) at 500 r.p.m. for 30 seconds by spinner coating, followed by drying at 60° C. for 1 hour, thereby forming an adhesive layer of 3 μm in thickness. In this manner, Laminate 1 was formed.

With metal particles obtained by mixing selenium with 13% by weight of tellurium, on the other hand, an amorphous selenium tellurium thin film was vapor-deposited onto an ITO glass substrate (of 1 mm in thickness and 5 cm² in size) to a thickness of 1.5 μm at a vacuum degree of $10^{-5}$ Torr by resistance heating. Further, an amorphous selenium layer of 25 μm in thickness was vapor-deposited onto the a-Se-Te layer at that vacuum degree to form Laminate 2.

Laminates 1 and 2 placed on upon the other was pressed at 50° C. (at 10 atm for 1 minute). Afterwards, the synthetic medium was removed, followed by the releasing of the glass substrate from Laminate 1, thereby obtaining the end photographic plate.

Industrial Applicability

As described above, it is possible to record a very sharp mask image without causing it to blur and so prepare a precise color filter. In this case, any precisely close contact of the photographic material with the mask can be dispensed with. It is also possible to transfer and reproduce a color hologram at one exposure operation, thereby preparing a color hologram of improved resolution with no need of precise alignment or registration. In addition, it is possible to provide an efficient preparation of filter photographic materials, which provide a lot of advantages when applied to recording clear electrostatic images.

What is claimed is:

1. A process for forming a filter photographic material, comprising the steps of:
    a) creating a first laminent including the substeps of (a1) laminating a release layer onto a carrier film, (a2) laminating a filter layer onto said release layer, and (a3) laminating an adhesive onto said filter layer;
    b) creating a second laminent, including the substeps of (b1) laminating an electrode onto a transparent support, and (b2) laminating a photoconductive layer onto said electrode;
    c) laminating said first laminent and said second laminent together, utilizing said adhesive layer of said first laminate; and d) removing said carrier film.

2. A process for forming a filter photographic material, comprising the steps of:
    a) creating a first laminent including the substeps of (a1) laminating a filter layer onto a transparent support, and (a2) laminating an adhesive onto said filter layer;
    b) creating a second laminent, including the substeps of (b1) laminating a release layer onto a carrier film, (b2) laminating a photoconductive layer onto said release layer, and (b3) laminating an electrode onto said photoconductive layer;
    c) laminating said first laminent and said second laminent together utilizing said adhesive layer of said first laminate; and
    d) removing said carrier film.

* * * * *